(12) United States Patent
Aoike

(10) Patent No.: US 11,677,018 B2
(45) Date of Patent: Jun. 13, 2023

(54) SEMICONDUCTOR DEVICE AND METHOD FOR PRODUCING THE SAME

(71) Applicant: Murata Manufacturing Co., Ltd., Kyoto-fu (JP)

(72) Inventor: Masayuki Aoike, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/901,980

(22) Filed: Jun. 15, 2020

(65) Prior Publication Data

US 2020/0403088 A1 Dec. 24, 2020

(30) Foreign Application Priority Data

Jun. 21, 2019 (JP) .............................. JP2019-115560
Mar. 10, 2020 (JP) .............................. JP2020-040801

(51) Int. Cl.
| | | |
|---|---|---|
| *H01L 23/373* | (2006.01) | |
| *H01L 29/737* | (2006.01) | |
| *H01L 23/00* | (2006.01) | |
| *H01L 23/498* | (2006.01) | |
| *H01L 21/50* | (2006.01) | |

(52) U.S. Cl.
CPC ............ *H01L 29/737* (2013.01); *H01L 21/50* (2013.01); *H01L 23/49811* (2013.01); *H01L 23/49838* (2013.01); *H01L 24/14* (2013.01)

(58) Field of Classification Search
CPC ......... H01L 24/14; H01L 24/17; H01L 23/36; H01L 23/3738
See application file for complete search history.

(56) References Cited

U.S. PATENT DOCUMENTS

| | | | |
|---|---|---|---|
| 2007/0131971 A1 | 6/2007 | Kim et al. | |
| 2007/0257275 A1 | 11/2007 | Taylor | |
| 2010/0270591 A1* | 10/2010 | Ahn .................... | H01L 29/7782 |
| | | | 257/194 |
| 2012/0161190 A1 | 6/2012 | Yao | |
| 2013/0221371 A1 | 8/2013 | Nakazawa et al. | |

(Continued)

FOREIGN PATENT DOCUMENTS

| | | |
|---|---|---|
| JP | 2016-103540 A | 6/2016 |
| JP | 2016-219682 A | 12/2016 |

OTHER PUBLICATIONS

"Thermal Conductivity of Metals, Metallic Elements and Alloys", The Engineering Toolbox (2005) (retrieved from https://www.engineeringtoolbox.com/thermal-conductivity-metals-d_858.html) (Year: 2005).*

(Continued)

*Primary Examiner* — Michele Fan
(74) *Attorney, Agent, or Firm* — Studebaker & Brackett PC

(57) ABSTRACT

A semiconductor device includes a substrate, a circuit element disposed on or above the upper surface of the substrate, an electrode disposed on or above the upper surface of the substrate and connected to the circuit element, and a conductor pillar bump for external connection which is disposed on the substrate and electrically connected to the electrode or the circuit element. The substrate includes a first base and a second base disposed on the first base. The circuit element and the electrode are disposed on the second base. The first base has lower thermal resistance than the second base.

9 Claims, 13 Drawing Sheets

(56) References Cited

U.S. PATENT DOCUMENTS

| | | | |
|---|---|---|---|
| 2015/0008570 A1* | 1/2015 | Arai | H01L 23/4334 |
| | | | 257/687 |
| 2015/0084104 A1 | 3/2015 | Ando | |
| 2015/0084179 A1* | 3/2015 | Hatori | H01L 25/18 |
| | | | 257/706 |
| 2015/0366048 A1* | 12/2015 | Nagase | H01L 23/4006 |
| | | | 174/252 |
| 2016/0322327 A1* | 11/2016 | Hino | H01L 24/83 |
| 2016/0343837 A1 | 11/2016 | Sasaki et al. | |
| 2017/0170365 A1 | 6/2017 | Lim et al. | |
| 2017/0271300 A1 | 9/2017 | Watanabe | |
| 2018/0097092 A1 | 4/2018 | Obu et al. | |
| 2018/0114828 A1* | 4/2018 | Adusumilli | H01L 27/0802 |
| 2018/0145052 A1* | 5/2018 | Dasgupta | H01L 29/7787 |
| 2019/0109066 A1 | 4/2019 | Kondo et al. | |
| 2019/0172806 A1 | 6/2019 | Kurokawa | |

OTHER PUBLICATIONS

"Young's Modulus, Tensile Strength and Yield Strength Values for some Materials", The Engineering Toolbox (2003) (retrieved from https://www.engineeringtoolbox.com/young-modulus-d_417.html) (Year: 2003).*

Osterlund et al., "Mechanical properties and reliability of aluminum nitride thin films", Journal of Alloys and Compounds (2019): pp. 306-313. (Year: 2019).*

Definition of "immediate", http://www.merriam-webster.com (2021) (Year: 2021).*

* cited by examiner

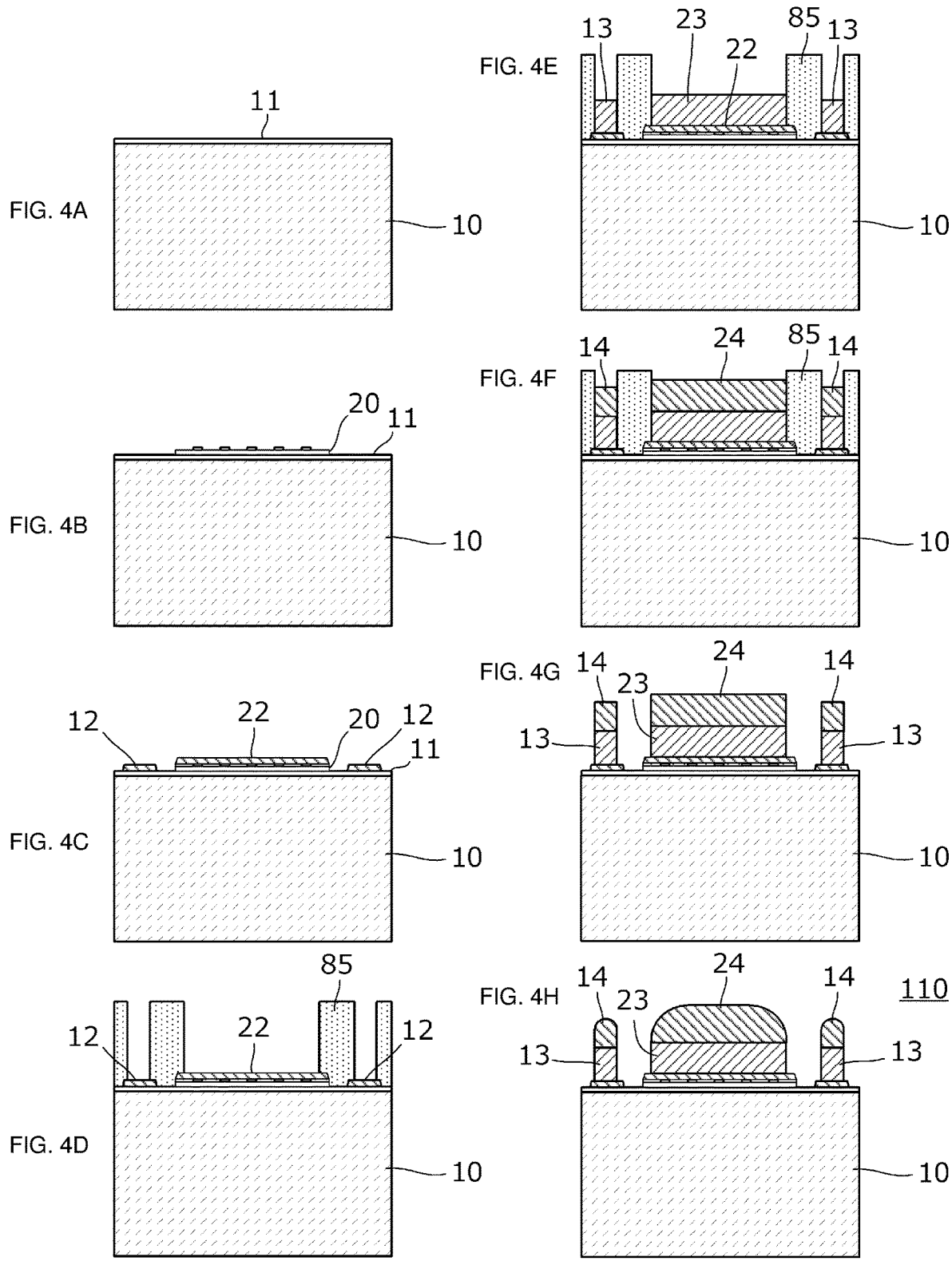

<COMPARATIVE EXAMPLE>

SEMICONDUCTOR DEVICE AND METHOD FOR PRODUCING THE SAME

CROSS-REFERENCE TO RELATED APPLICATIONS

This application claims benefit of priority to Japanese Patent Application No. 2019-115560, filed Jun. 21, 2019, and to Japanese Patent Application No. 2020-040801, filed Mar. 10, 2020, the entire contents of each are incorporated herein by reference.

BACKGROUND

Technical Field

The present disclosure relates to a semiconductor device and specifically to a semiconductor device that is used for high-frequency circuits and includes heating parts and a method for producing the semiconductor device.

Background Art

Semiconductor devices attached to a mounting substrate with bumps, which are used also as heat dissipation paths, are known in the related art.

For example, Japanese Unexamined Patent Application Publication No. 2016-103540 discloses a compound semiconductor device that includes a compound semiconductor substrate and a heterojunction bipolar transistor (HBT) disposed on the compound semiconductor substrate, the HBT being constituted by a plurality of unit transistors arranged parallel to one another. The unit transistors are disposed on the compound semiconductor substrate. The emitters of the unit transistors are electrically connected to a bump.

SUMMARY

With recent increases in the speed and functionality of monolithic microwave integrated circuits (MMICs) including high-frequency amplifier circuits, which are used for mobile communication, satellite communication, and the like, there have been increasing concerns about limitations of the characteristics of the MMICs which are imposed due to an increase in the loss in an RF front-end (RFFE) and self-heating of a power amplifier device. For example, a bipolar transistor generates heat due to the collector loss. An increase in the temperature of the bipolar transistor results in a reduction in the base-emitter voltage Vbe. If this results in an increase in the collector current and a further reduction in Vbe, that is, a positive feedback is done, thermal runaway may occur. In the case where the heat-dissipation capacity of an MMIC is not high, the power that can be used within the range in which thermal runaway does not occur is limited. As a result, the available power and the size of an MMIC are mutually incompatible.

Since RFFE modules include devices including various substrates composed of different materials, such as a power amplifier including a GaAs substrate and a SAW device including a $LiTaO_3$ or $LiNbO_3$ substrate, a further increase in functionality, further reductions in size and costs, and a further increase in the degree of integration of different types of devices have been anticipated.

Accordingly, the present disclosure provides a semiconductor device that has a high heat-dissipation capacity and a high power and is suitable for an increase in the degree of integration and a method for producing the semiconductor device.

According to preferred embodiments of the present disclosure, a semiconductor device includes a substrate, a circuit element disposed on or above a surface of the substrate, an electrode disposed on or above the surface of the substrate, the electrode being connected to the circuit element, and a conductor protrusion for external connection. The conductor protrusion being disposed on or above the substrate and connected to the circuit element or the electrode. The substrate includes a first base and a second base disposed on or above the first base, the second base being composed of a material different from a material constituting the first base. The circuit element and the electrode are disposed on or above the second base. The first base has a higher thermal conductivity than the second base.

According to preferred embodiments of the present disclosure, a method is provided for producing a semiconductor device including a substrate, a circuit element disposed on or above a surface of the substrate, an electrode disposed on or above the surface of the substrate, the electrode being connected to the circuit element, and a conductor protrusion for external connection. The conductor protrusion is disposed on or above the substrate and electrically connected to the circuit element or the electrode. The substrate includes a first base and a second base disposed on or above the first base, and the circuit element and the electrode being disposed on or above the second base. The method includes a step of forming a semiconductor thin film including the circuit element and the electrode disposed on a surface of the semiconductor thin film on a base composed of a compound semiconductor with a release layer interposed between the semiconductor thin film and the base composed of a compound semiconductor; and a step of removing the release layer by etching to separate the semiconductor thin film from the base composed of a compound semiconductor. The method also includes a step of joining the semiconductor thin film constituting the second base to a predetermined part of a base composed of an elemental semiconductor, the base composed of an elemental semiconductor constituting the first base; and a step of forming a conductor protrusion for external connection on the second base. The conductor protrusion is connected to the circuit element or the electrode.

According to preferred embodiments of the present disclosure, a semiconductor device that has a high heat-dissipation capacity and therefore has a high power while being compact or is therefore small in size while having a high power may be produced.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIGS. 4A to 4H are diagrams illustrating a method for producing the semiconductor device 110;

DETAILED DESCRIPTION

Figure 1:
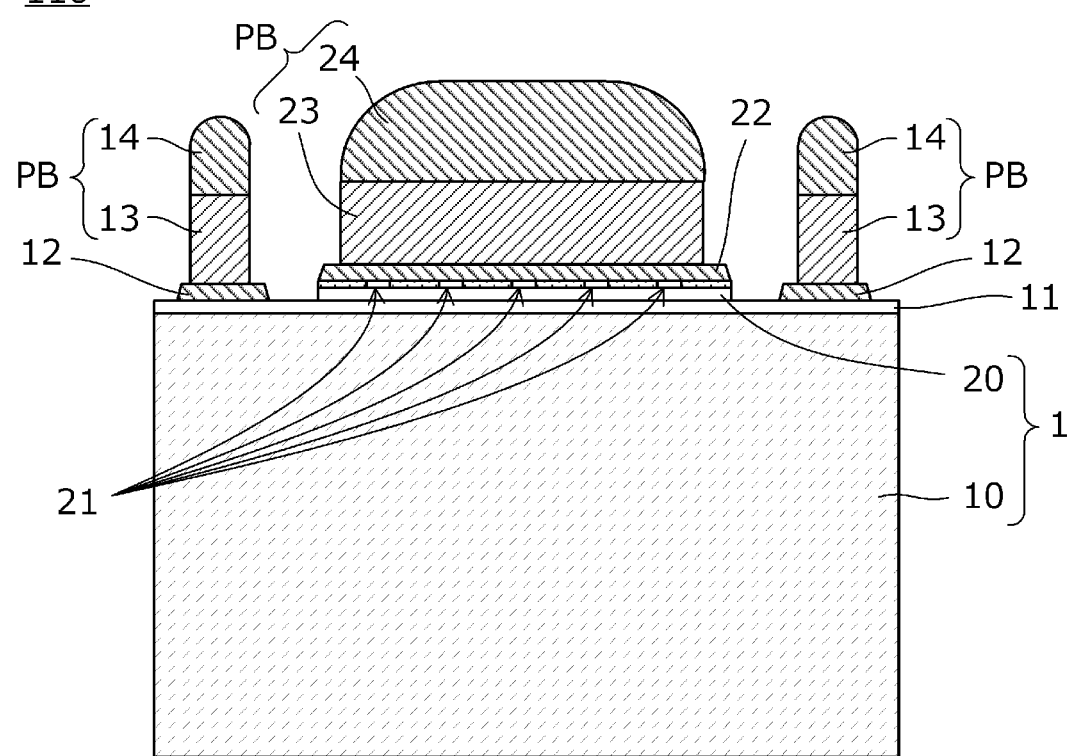
FIG. 1 is a cross-sectional view of a semiconductor device 110 according to a first embodiment.

Embodiments of the present disclosure are described below on the basis of some specific examples with reference to the attached drawings. In the drawings, the same components are denoted by the same reference numerals. In order to describe the main points or increase understandability, an embodiment may be divided into a plurality of embodiments for the sake of simplicity. Structures described in different embodiments may be partially replaced or combined with one another. In and after the second embodiment, descriptions of things that are common to the first embodiment are omitted; only things different from the first embodiment are described. The similar operations and effects of the same structure are not mentioned in each embodiment.

First Embodiment

FIG. 1 is a cross-sectional view of a semiconductor device 110 according to a first embodiment. The semiconductor device 110 includes a substrate 1; a second base-side electrode 22 disposed on the substrate 1; a conductor pillar 23 disposed on the second base-side electrode 22 so as to be electrically connected to the second base-side electrode 22, and a solder layer 24 disposed on the conductor pillar 23. The conductor pillar 23 and the solder layer 24 constitute a conductor pillar bump PB.

The substrate 1 includes a first base 10 and a second base 20 disposed on the first base 10. A plurality of circuit elements 21 and an electrode through which an operating voltage or current is applied to the circuit elements 21 are disposed on the second base 20. The second base 20 is formed in another step as described below. The circuit elements are disposed on an epitaxial layer. The thickness of the epitaxial layer is, for example, about 3 µm. The thickness of the electrode (i.e. wiring layer) is about 10 µm. The projections included in the circuit elements 21 illustrated in FIG. 1 are electrodes electrically conducted to the circuit elements 21.

The semiconductor device 110 according to the first embodiment includes first base-side electrodes 12, which are disposed on a portion of the surface of the first base 10 which does not overlap the second base 20. The semiconductor device 110 further includes conductor pillars 13 connected to the first base-side electrodes 12 and solder layers 14 disposed on the conductor pillars 13. The conductor pillars 13 and the solder layers 14 form conductor pillar bumps PB.

The above-described conductor pillar bumps PB correspond to the "conductor protrusions" for external connection according to the present disclosure.

In this example, the first base 10 is composed of a material including any of GaAs, AlAs, InAs, InP, GaP, InSb, GaN, InN, AlN, Si, Ge, SiC, $Ga_2O_3$, diamond-like carbon (DLC), graphite, diamond, glass, sapphire, and $Al_2O_3$ or a multicomponent mixed crystal material including two or more selected from the above materials, and the second base 20 is composed of a material including any of GaAs, AlAs, InAs, InP, GaP, InSb, GaN, InN, AlN, SiGe, SiC, $Ga_2O_3$, and GaBi or a multicomponent mixed crystal material including two or more selected from the above materials. Note that the material used as the first base 10 and the material used as the second base 20 are different from each other, and the process for producing the first base 10 and the process for producing the second base 20 are different from each other. Basically, the material constituting the second base 20 is selected such that predetermined electrical characteristics, such as amplification factor and cutoff frequency, are achieved, and the material constituting the first base 10 is selected such that the first base 10 has a higher thermal conductivity than the second base 20. The same applies to the other embodiments described below.

In this embodiment, the first base 10 is a Si base, and the second base 20 is a GaAs base. The thermal conductivities of the Si base and the GaAs base are 156 W/cm K and 46 W/cm K, respectively. The circuit elements 21 are, for example, heterojunction bipolar transistors (HBTs) including a plurality of unit transistors connected in parallel to one another. The circuit elements 21 are formed by subjecting the GaAs base, that is, the second base 20, to a processing. The conductor pillar bump PB is electrically connected to the emitters of the unit transistors. The unit transistors are arranged in a first direction (i.e., the horizontal direction in FIG. 1). The conductor pillar bump PB is arranged to extend in the first direction.

The second base 20 is joined to the first base 10 with a joint layer 11 interposed therebetween. The joint layer 11 is a Au film or the like.

The conductor pillars 13 and 23 are Cu-coating films. The solder layers 14 and 24 are SnAg alloy films.

Figure 2A:
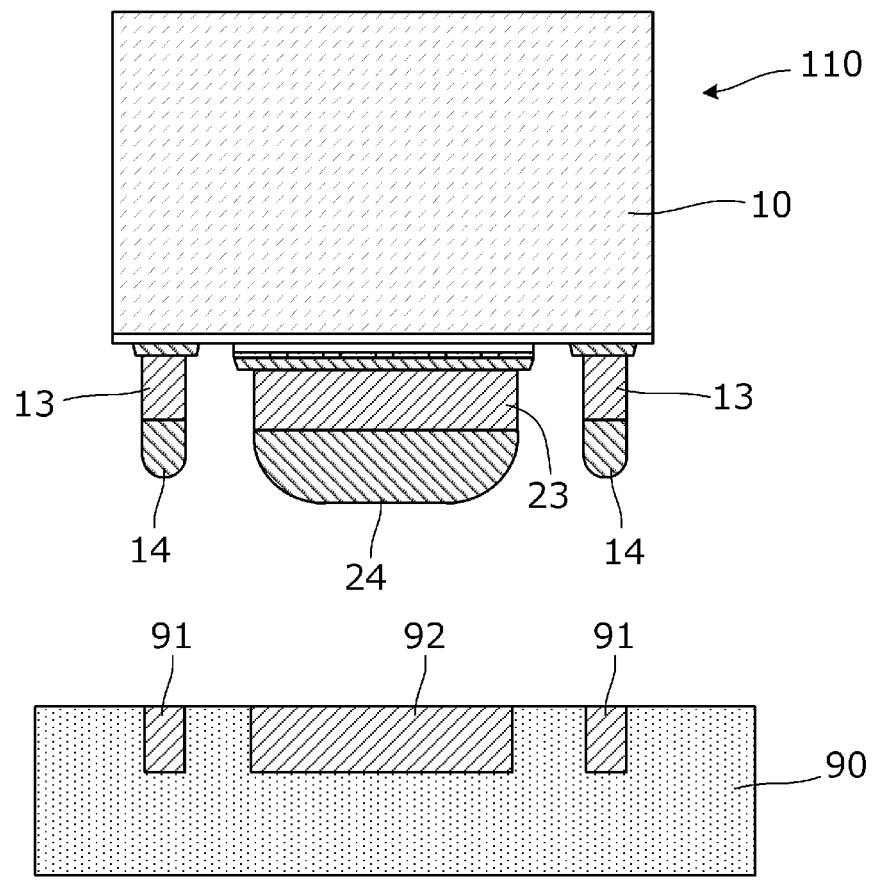
FIGS. 2A and 2B are cross-sectional views of a mounting substrate and the semiconductor device 110 attached to the mounting substrate.
Figure 2B:
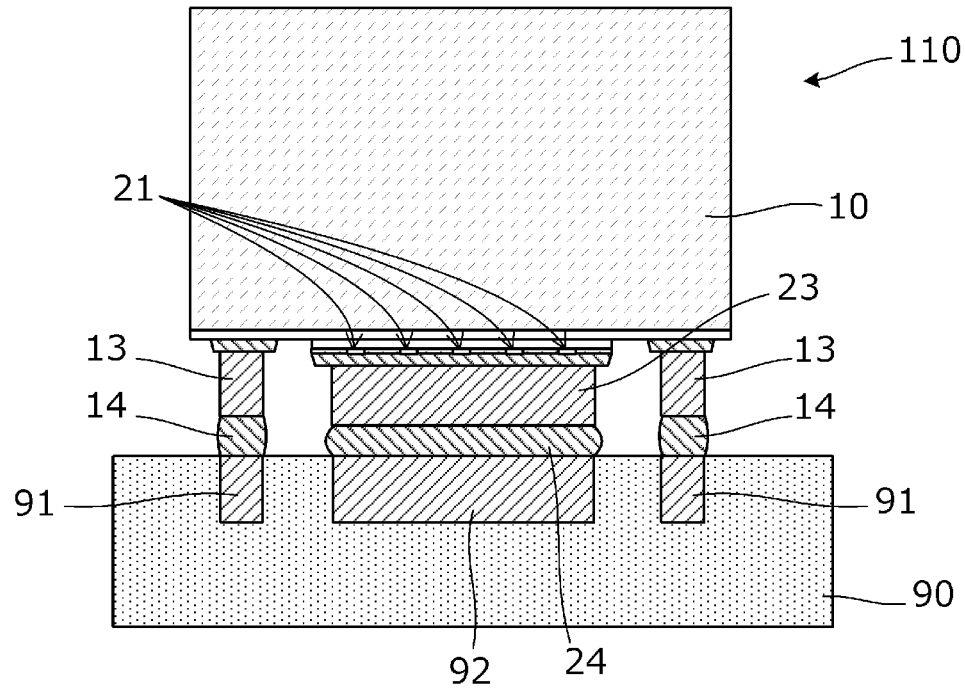

FIGS. 2A and 2B are cross-sectional views of a mounting substrate and the semiconductor device 110 attached to the mounting substrate. FIG. 2A is a cross-sectional view of a mounting substrate 90 and the semiconductor device 110 that is to be attached to the mounting substrate 90, while FIG. 2B is a cross-sectional view of the mounting substrate 90 and the semiconductor device 110 that has been attached to the mounting substrate 90.

The mounting substrate 90 is provided with mounting substrate-side electrodes 91 and 92 formed therein. When the semiconductor device 110 is subsequently heated and pressed while the solder layers 14 and 24 of the semiconductor device 110 are aligned with the mounting substrate-side electrodes 91 and 92, the solder layers 14 and 24 of the semiconductor device 110 are connected to the mounting substrate-side electrodes 91 and 92 as illustrated in FIG. 2B.

Figure 17:
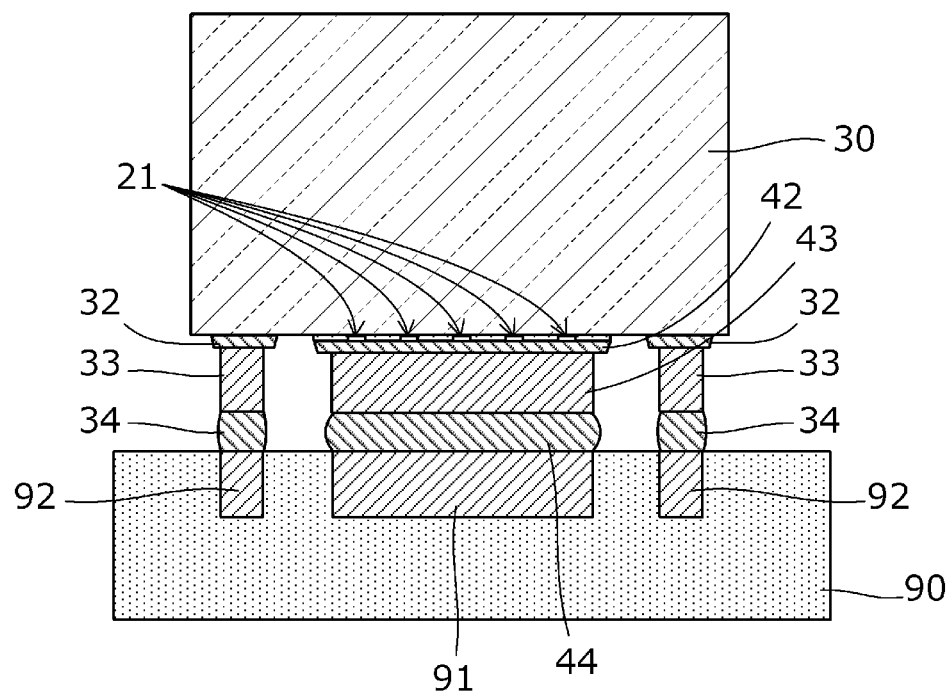
FIG. 17 is a cross-sectional view of a semiconductor device of a comparative example attached to a mounting substrate.

The structure of another semiconductor device is described below as a comparative example. FIG. 17 is a cross-sectional view of the comparative semiconductor device disposed on a mounting substrate. In the comparative semiconductor device, the circuit elements are formed on a GaAs substrate 30. Electrodes 32 and 42 are disposed on the surface of the GaAs substrate 30. A conductor pillar 43 and a solder layer 44 are disposed on and above the electrode 42. Conductor pillars 33 and solder layers 34 are disposed on and above the electrodes 32. The solder layers 34 and 44 of the semiconductor device are connected to the mounting substrate-side electrodes 91 and 92, respectively.

As illustrated in FIG. 1, the levels of the solder layer 24 and the solder layers 14 differ from each other by an amount equal to the thickness of the second base 20. Such a small difference in level may be absorbed by the solder layers 14 and 24.

The heat dissipation capacities of the comparative semiconductor device and the semiconductor device 110 according to the first embodiment are described below with reference to FIGS. 3A and 3B.

Figure 3A:
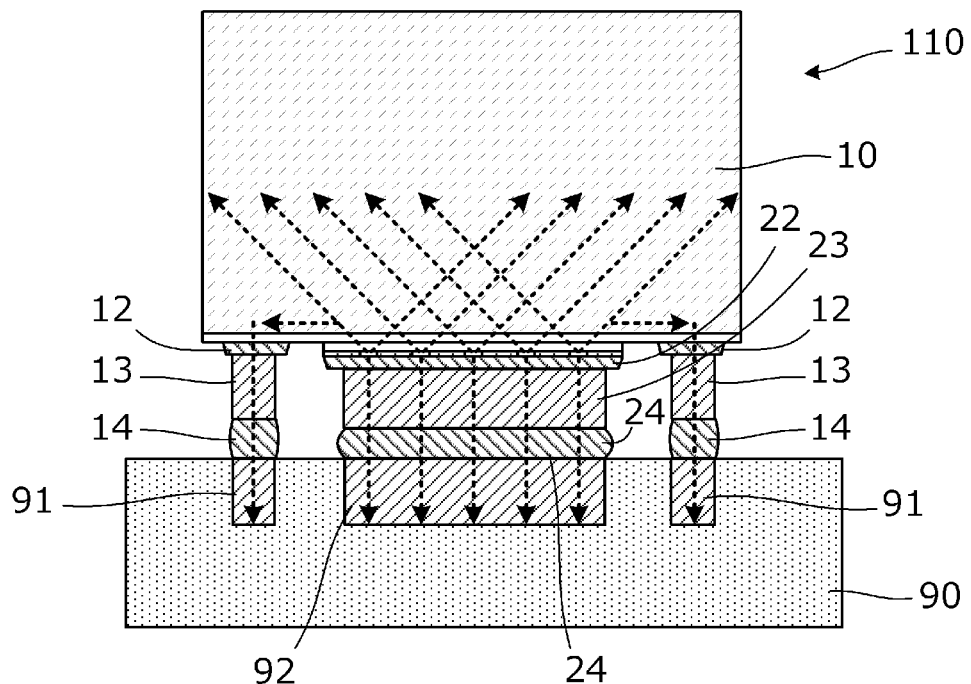
FIG. 3A is a cross-sectional view of the semiconductor device 110, illustrating heat dissipation paths.
Figure 3B:
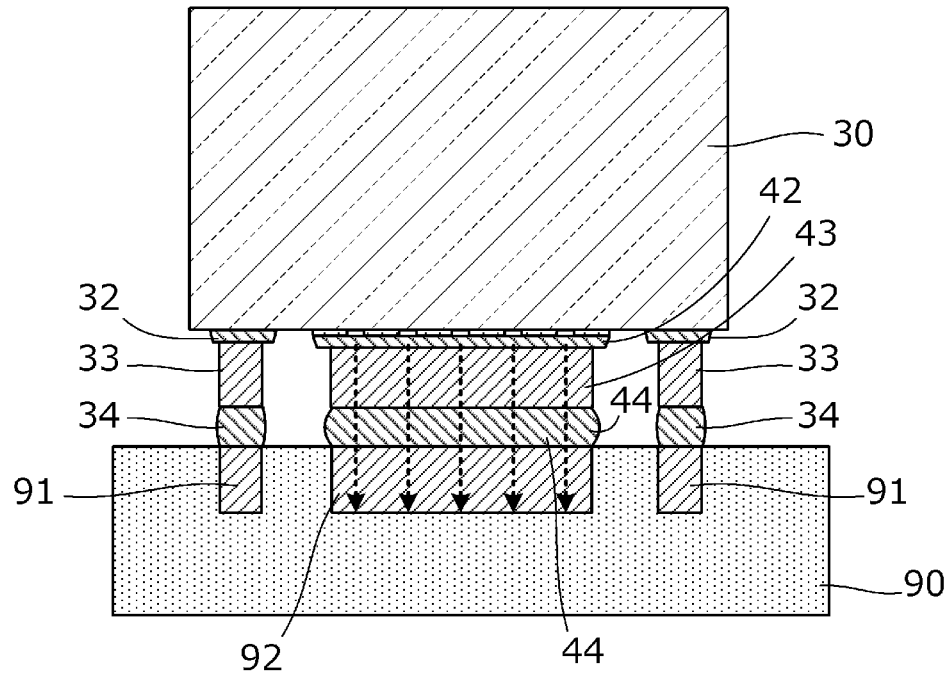
FIG. 3B is a cross-sectional view of a semiconductor device of a comparative example, illustrating a heat dissipation path.

In the comparative semiconductor device, the heat generated by the circuit elements is dissipated (i.e., exhausted) into the mounting substrate-side electrodes 92 and the mounting substrate 90 through the electrode 42, the conductor pillar 43, and the solder layer 44 as denoted by the dashed arrow in FIG. 3B.

On the other hand, in the semiconductor device 110 according to the first embodiment, the heat is dissipated along three heat-conduction paths as denoted by the dashed arrow in FIG. 3A. A first heat-conduction path is the path along which the heat generated by the circuit elements is dissipated (i.e., exhausted) into the mounting substrate-side electrode 92 and the mounting substrate 90 through the second base-side electrode 22, the conductor pillar 23, and the solder layer 24. A second heat-conduction path is the path along which the heat generated by the circuit elements is dissipated (i.e., exhausted) into the first base 10. The first base 10 is a Si base, which has a thermal conductivity of 156 W/cm K. The GaAs substrate 30 has a thermal conductivity of 46 W/cm K. Since the first base 10 has a higher thermal conductivity than the second base 20, the first base 10 serves as a high-efficiency thermal radiator. A third heat-conduction path is the path along which the heat generated by the circuit elements is dissipated (i.e., exhausted) into the mounting substrate-side electrodes 91 and the mounting substrate 90 through the first base 10, the first base-side electrodes 12, the conductor pillars 13, and the solder layers 14. The first base 10 serving as a heat-conduction path as described above enables the conductor pillars 13, the solder layers 14, and the mounting substrate-side electrodes 91 to serve as a heat-conduction path.

The above-described semiconductor device 110 according to the first embodiment may produce the following advantageous effects.

The formation of the three heat dissipation paths enables a high heat-dissipation capacity. This may improve the RF characteristics (output power Pout and power added efficiency PAE) which may be limited due to the self-heating of the HBT. That is, a semiconductor device having a high power although being compact or a semiconductor device having a small size although having a high power may be produced.

Since the second base is a base composed of a compound semiconductor, the electrical insulating properties of the second base may be enhanced and a circuit having excellent high-frequency characteristics may be formed.

Since the second base 20 has a smaller thickness than the first base 10, the first base 10 may produce a high heat dissipation effect.

Since the circuit elements 21 disposed on the second base 20 is a heating element that generates heat during operation and the conductor pillar bump PB is disposed in the immediate vicinity of the circuit elements 21 serving as a heating element, the conductor pillar bump forms a short heat-conduction path and the heat generated by the circuit elements 21 may be dissipated through the conductor pillar bump PB with a high degree of efficiency.

Since the second base 20 is not protruded from the edges of the first base 10 (i.e., has a smaller area than the first base 10), the overall thermal resistance of the substrate 1 that includes the first base 10 and the second base 20 is low and the first base 10 may produce a high heat dissipation effect.

Since the first base-side electrodes 12 are disposed on the surface of a portion of the first base 10 which does not overlap the second base 20 and the conductor pillar bumps PB are connected to the first base-side electrodes 12, the conductor pillar bumps PB connected to the first base-side electrodes 12 may produce a heat dissipation effect. In addition, the efficiency with which the heat is conducted to the circuit board, to which the semiconductor device is attached, through the conductor pillar bumps PB may be increased. This leads to an increase in the heat-dissipation capacity of the circuit board.

An example of a method for producing the semiconductor device 110 is described below. FIGS. 4A to 4H are diagrams illustrating a method for producing the semiconductor device 110. FIGS. 4A to 4G are cross-sectional views of the semiconductor device 110 that is in the middle of production. FIG. 4H is a cross-sectional view of the completed semiconductor device 110. Although the semiconductor devices are produced on a wafer-to-wafer basis in reality, FIGS. 4A to 4H illustrate only one semiconductor device.

First, a Au film that serves as a joint layer 11 is formed on the surface of a first base 10 that is a Si base as illustrated in FIG. 4A by a common semiconductor manufacturing process.

A second base 20 is joined to the joint layer 11 as illustrated in FIG. 4B. The second base 20 includes circuit elements and an electrode that have been formed thereon in another step.

A second base-side electrode 22 is formed on the second base 20 and first base-side electrodes 12 are formed on the joint layer 11 as illustrated in FIG. 4C by a common semiconductor manufacturing process.

A resist film 85 having cavities formed in regions in which conductor pillars 13 and solder layers 14 (see FIGS. 1 and 2A) are to be formed is formed as illustrated in FIG. 4D. The electrodes 12 and 22 are exposed at the cavities of the resist film 85.

Conductor pillars 13 and 23 and solder layers 14 and 24 are deposited on the electrodes 12 and 22, which are exposed at the cavities of the resist film 85, as illustrated in FIGS. 4E and 4F by plating. The conductor pillars 13 and 23 are composed of Cu and have a thickness of, for example, 40 μm. Hereby, copper pillar bumps (CPBs) are formed. The solder layers 14 and 24 are composed of a SnAg alloy and have a thickness of, for example, 30 µm.

The resist film 85 is removed as illustrated in FIG. 4G. Finally, reflow soldering is performed to melt the solder layers 14 and 24. Subsequently, the solder layers 14 and 24 are solidified. Hereby, the semiconductor device 110 illustrated in FIG. 4H is produced.

According to the above production method, since the second base 20 is a semiconductor thin film, a low-profile semiconductor device having a high heat-dissipation capacity (i.e., high thermal conductivity) may be produced.

While a Au film is formed as a joint layer 11 in the above example illustrated in FIGS. 1 to 4H, a metal film other than a Au film, such as a Pt film or a Pd film, may be used instead. The joint layer 11 preferably has a higher thermal conductivity than the second base 20. In such a case, the heat of the second base 20 may be exhausted into the first base 10 through the joint layer 11 with a high degree of efficiency. For example, while the thermal conductivity of a GaAs base, which is used as a second base 20, is 46 W/m K, the thermal conductivities of a Au film, a Pt film, and a Pd film are 319, 70, and 70 W/m K, respectively. That is, a Au film, a Pt film, and a Pd film have a higher thermal conductivity than the second base 20.

The joint layer 11 more preferably has a lower modulus of elasticity than the second base 20. Since the coefficient of linear expansion of the first base 10 differs from that of the second base 20, a change in temperature causes a thermal stress due to the difference in coefficient of linear expansion. When the joint layer 11 has a lower modulus of elasticity than the second base 20, the thermal stress may be reduced and, consequently, the virtual strength at which the first base 10 and the second base 20 are joined to each other with the joint layer 11 interposed therebetween may be maintained. For example, while a GaAs base has a modulus of elasticity of 85.5 GPa, the modulus of elasticity of a Au film is 78 GPa, the modulus of elasticity of an Al film is 68.3 GPa, and the modulus of elasticity of an In film is 10.8 GPa. That is, a Au film, an Al film, and an In film have a lower modulus of elasticity than the second base 20.

In the case where the joint layer 11 is composed of a metal, an alloy layer formed by alloying the joint layer 11 with the second base 20 may be interposed between the joint layer 11 and the second base 20. In such a case, further high adhesion and a further large heat-conduction effect may be achieved.

Alternatively, the joint layer 11 may be a dielectric composed of an organic material, such as polyimide (PI), polybenzooxazole (PBO), or benzocyclobutene (BCB). The joint layer 11 preferably has a lower dielectric constant than the second base 20. One of the high-frequency characteristics of the circuit elements disposed on the second base 20 is high-frequency signal transmission loss characteristics. If the joint layer 11 has a higher dielectric constant than the second base 20, arranging the joint layer 11 to come into close contact with the second base 20 may degrade the high-frequency signal transmission loss characteristics of the circuit elements. When the joint layer 11 has a lower dielectric constant than the second base 20, the degradation of transmission loss characteristics may be prevented. For example, while the relative dielectric constant of a GaAs base, which is used as a second base 20, is 12.9, the dielectric constants of polyimide (PI), polybenzooxazole (PBO), and benzocyclobutene (BCB) are 3.3, 2.9, and 2.7, respectively. That is, polyimide (PI), polybenzooxazole (PBO), and benzocyclobutene (BCB) have a lower dielectric constant than the second base 20.

The joint layer 11 preferably has a smaller dielectric tangent than the second base 20. If the joint layer 11 has a large dielectric tangent, the high-frequency loss caused by the joint layer 11 may be increased. When the joint layer 11 has a smaller dielectric tangent than the second base 20, the increase in high-frequency loss may be prevented. For example, while the dielectric tangent of a GaAs base, which is used as a second base 20, is 0.3, the dielectric tangents of polyimide (PI), polybenzooxazole (PBO), and benzocyclobutene (BCB) are 0.0020, 0.0100, and 0.0008, respectively. That is, polyimide (PI), polybenzooxazole (PBO), and benzocyclobutene (BCB) have a smaller dielectric tangent than the second base 20.

Even in the case where the joint layer 11 is composed of an organic material, the joint layer 11 more preferably has a lower modulus of elasticity than the second base 20. In such a case, the virtual strength at which the first base 10 and the second base 20 are joined to each other with the joint layer 11 interposed therebetween may be maintained. For example, while a GaAs base has a modulus of elasticity of 85.5 GPa, the modulus of elasticity of polyimide (PI) is 2.5 GPa, the modulus of elasticity of polybenzooxazole (PBO) is 2.8 GPa, and the modulus of elasticity of benzocyclobutene (BCB) is 2.1 GPa. That is, polyimide (PI), polybenzooxazole (PBO), and benzocyclobutene (BCB) have a lower modulus of elasticity than the second base 20.

In another case, the joint layer 11 may be composed of an insulator, such as AlN, SiC, or diamond. This joint layer 11 preferably has a higher electric resistivity than the first base 10. When the joint layer 11 has a higher electric resistivity than the first base 10, the induced current and eddy current that flow through the joint layer 11 and the first base 10 are reduced and, consequently, the high-frequency characteristics of the circuit elements disposed on the second base 20 may be maintained to be suitable.

Even in the case where the joint layer 11 is composed of an insulator, the joint layer 11 preferably has a higher thermal conductivity than the first base 10. In such a case, the heat of the second base 20 may be exhausted into the first base 10 through the joint layer 11 with a high degree of efficiency. For example, while the thermal conductivity of a Si base, which is used as a first base 10, is 156 W/cm K, the thermal conductivities of an AlN film, a SiC film, and a diamond film are 170, 270, and 2000 W/cm K, respectively. That is, an AlN film, a SiC film, and a diamond film have a higher thermal conductivity than the first base 10.

Figure 5:
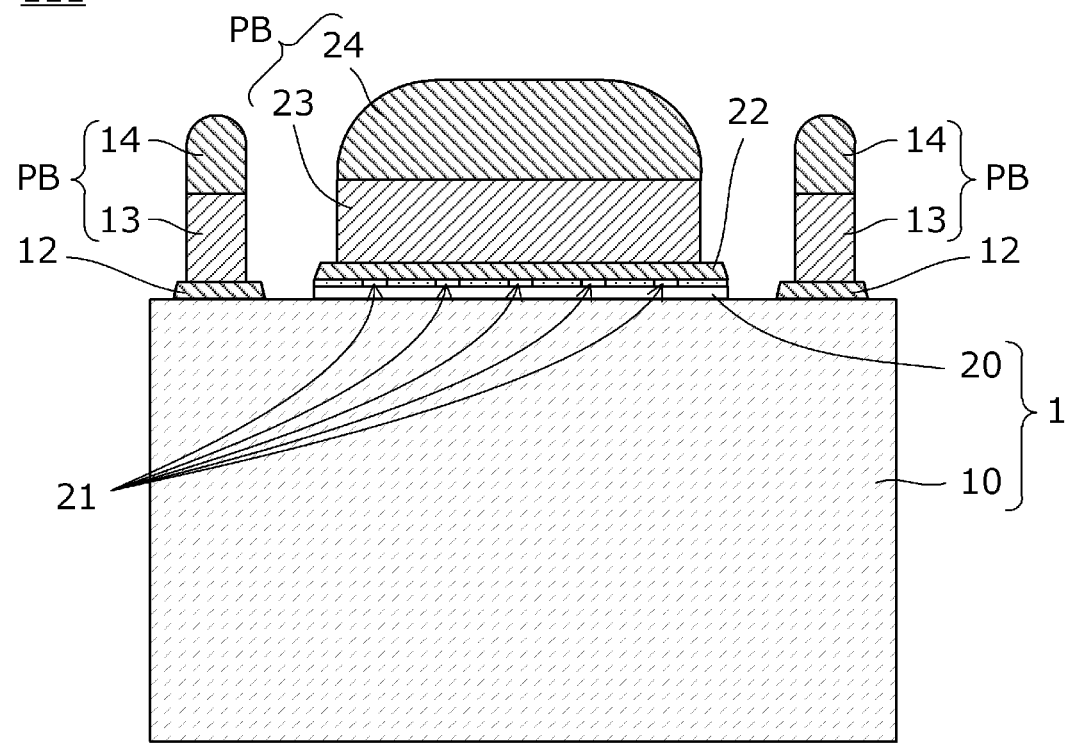
FIG. 5 is a cross-sectional view of a semiconductor device 111 according to a modification example of the first embodiment.

A modification example of the first embodiment is described below. FIG. 5 is a cross-sectional view of a semiconductor device 111 according to the modification example. The semiconductor device 111 does not include the joint layer 11 illustrated in FIG. 1. The second base 20 is joined directly to the first base 10. The first base 10 and the second base 20 are joined to each other due to Van der Waals bonding or hydrogen bonding. Alternatively, they may be joined to each other due to electrostatic force, covalent bonding, eutectic alloy bonding, or the like.

The first base-side electrodes 12 are disposed directly on the upper surface of the first base 10. A conductor pillar bump PB consisting of the conductor pillar 13 and the solder layer 14 is disposed on each of the first base-side electrodes 12.

As described above, the second base 20 may be joined directly to the first base 10 without the joint layer interposed therebetween.

Second Embodiment

A semiconductor device according to a second embodiment includes a conductor protrusion having a structure different from that of the conductor protrusions according to the first embodiment.

Figure 6:
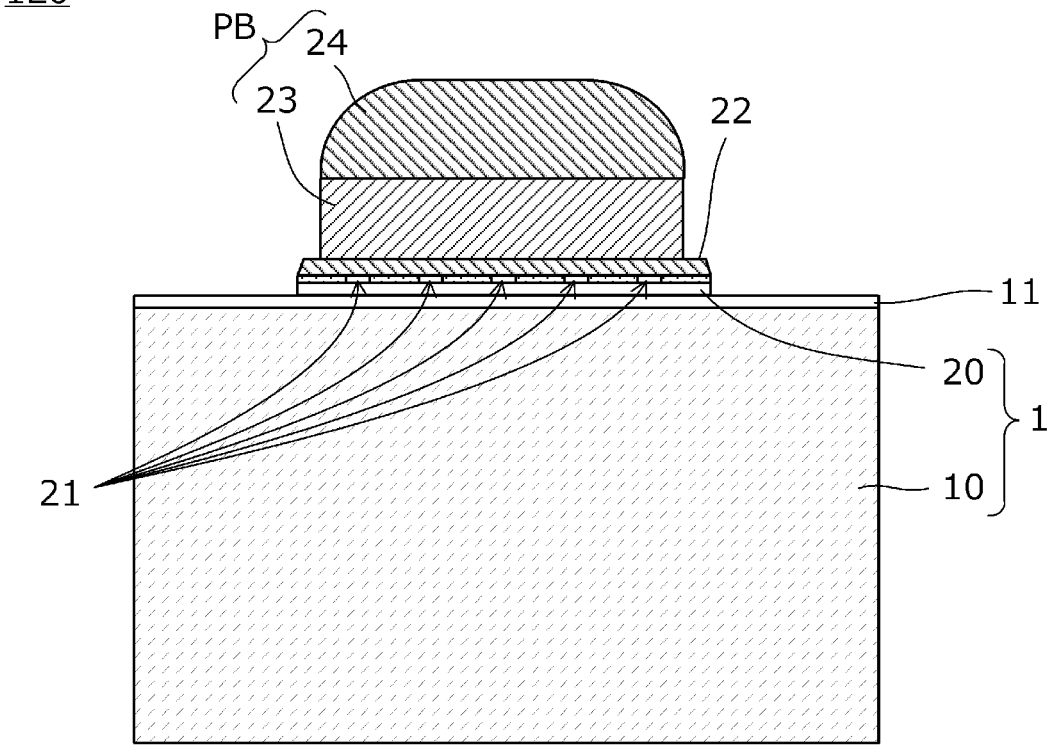
FIG. 6 is a cross-sectional view of a semiconductor device 120 according to a second embodiment.

FIG. 6 is a cross-sectional view of a semiconductor device 120 according to the second embodiment. Unlike the example illustrated in FIG. 1, the semiconductor device 120 does not include the first base-side electrodes 12 and the conductor protrusions for external connection (i.e., the conductor pillars 13 and the solder layers 14) connected to the first base-side electrodes 12.

Figure 7:
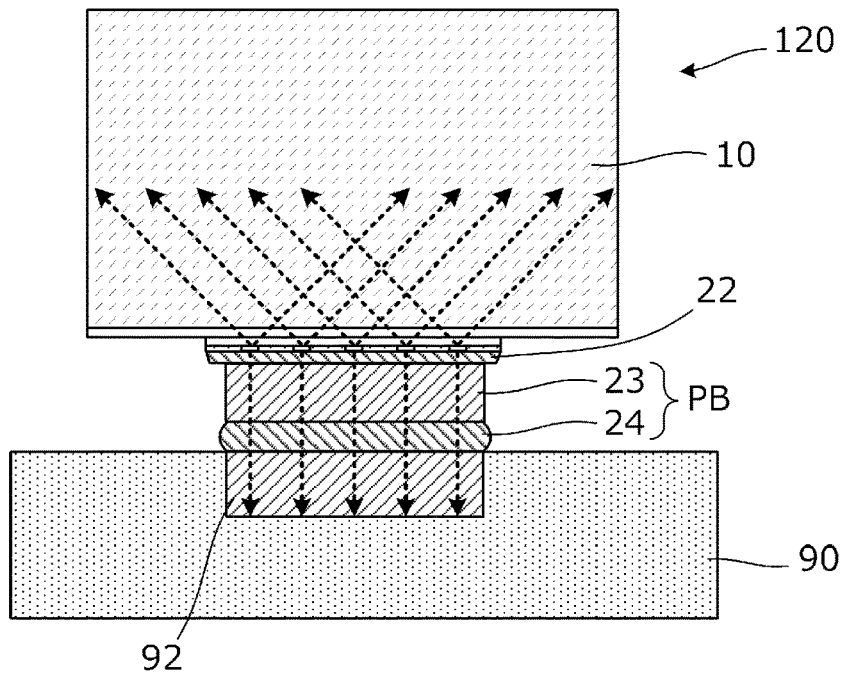
FIG. 7 is a cross-sectional view of a mounting substrate 90 and the semiconductor device 120 attached to the mounting substrate 90.

FIG. 7 is a cross-sectional view of the semiconductor device 120 attached to a mounting substrate 90. The mounting substrate 90 is provided with a mounting substrate-side electrode 92 formed therein. By aligning the conductor pillar bump PB with the mounting substrate-side electrode 92 and subsequently performing heating and pressing, a solder layer 24 of the semiconductor device 120 is connected to the mounting substrate-side electrode 92.

Even in the case where the above-described structure is employed, the heat may be dissipated (i.e., exhausted) from the heating parts in the two directions denoted with the broken arrows in FIG. 7.

Third Embodiment

In a third embodiment, some example semiconductor devices that include a flattening resin layer are described.

Figure 8A:
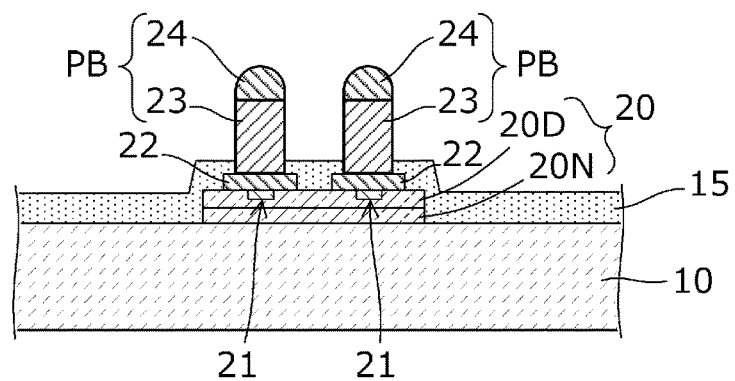
FIGS. 8A and 8B are cross-sectional views of semiconductor devices according to a third embodiment.
Figure 8B:
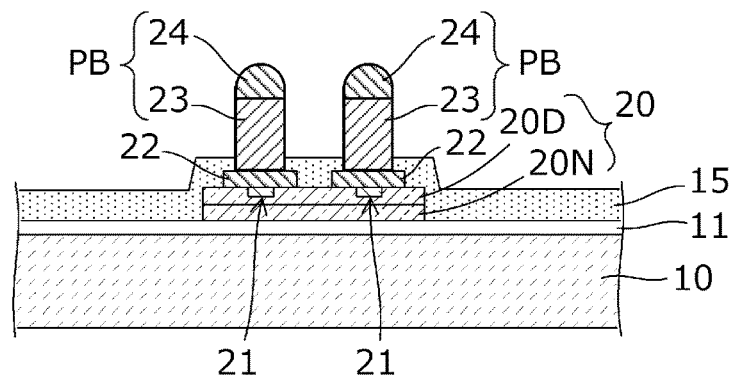

FIGS. 8A and 8B are cross-sectional views of semiconductor devices 130A and 130B according to the third embodiment. The semiconductor devices 130A and 130B include a first base 10 and a second base 20 disposed on the first base 10. The second base 20 includes a semiconductor base 20N composed of a compound semiconductor and an epitaxial layer 20D disposed on the surface of the semiconductor base 20N. A plurality of circuit elements 21 are disposed in the epitaxial layer 20D.

Second base-side electrodes 22 electrically continuous to the circuit elements 21 are disposed on the upper surface of the epitaxial layer 20D. A flattening resin layer 15 is disposed on the surfaces of the first base 10 and the second base 20. A conductor pillar bump PB consisting of a conductor pillar 23 and a solder layer 24 is disposed on the upper portion of each of the second base-side electrodes 22.

In the example illustrated in FIG. 8B, a joint layer 11 is disposed on the upper surface of the first base 10, and the second base 20 is joined to the first base 10 with the joint layer 11 interposed therebetween.

Figure 9:
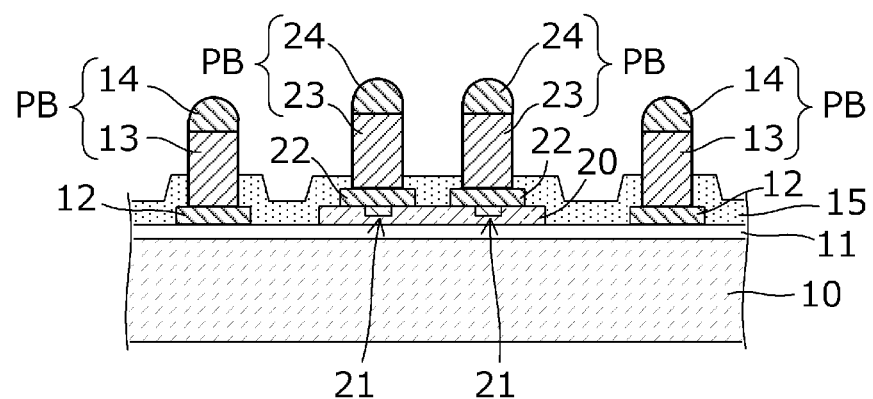
FIG. 9 is a cross-sectional view of another semiconductor device according to the third embodiment.

FIG. 9 is a cross-sectional view of another semiconductor device 131 according to the third embodiment. The semiconductor device 131 includes a first base 10 and a second base 20 disposed on the first base 10. A plurality of circuit elements are disposed in the second base 20. A joint layer 11 is disposed on the upper surface of the first base 10. A flattening resin layer 15 is disposed on the surfaces of the joint layer 11 and the second base 20. A conductor pillar bump PB consisting of a conductor pillar 13 and a solder layer 14 is disposed on the upper portion of each of the first base-side electrodes 12.

Examples of the flattening resin layer include a polyimide (PI) film, a polybenzooxazole (PBO) film, and a benzocyclobutene (BCB) film. Forming the flattening resin layer 15 on the surfaces of the first base 10 and the second base 20 makes it easy to form relatively thick conductor pillars 23 and relatively thick solder layers 24. Moreover, repassivation of the surfaces of the first base 10 and the second base 20 is performed.

Fourth Embodiment

In a fourth embodiment, an example semiconductor device that includes conductor protrusions for external connection which are disposed at a plurality of positions is described.

Figure 10:
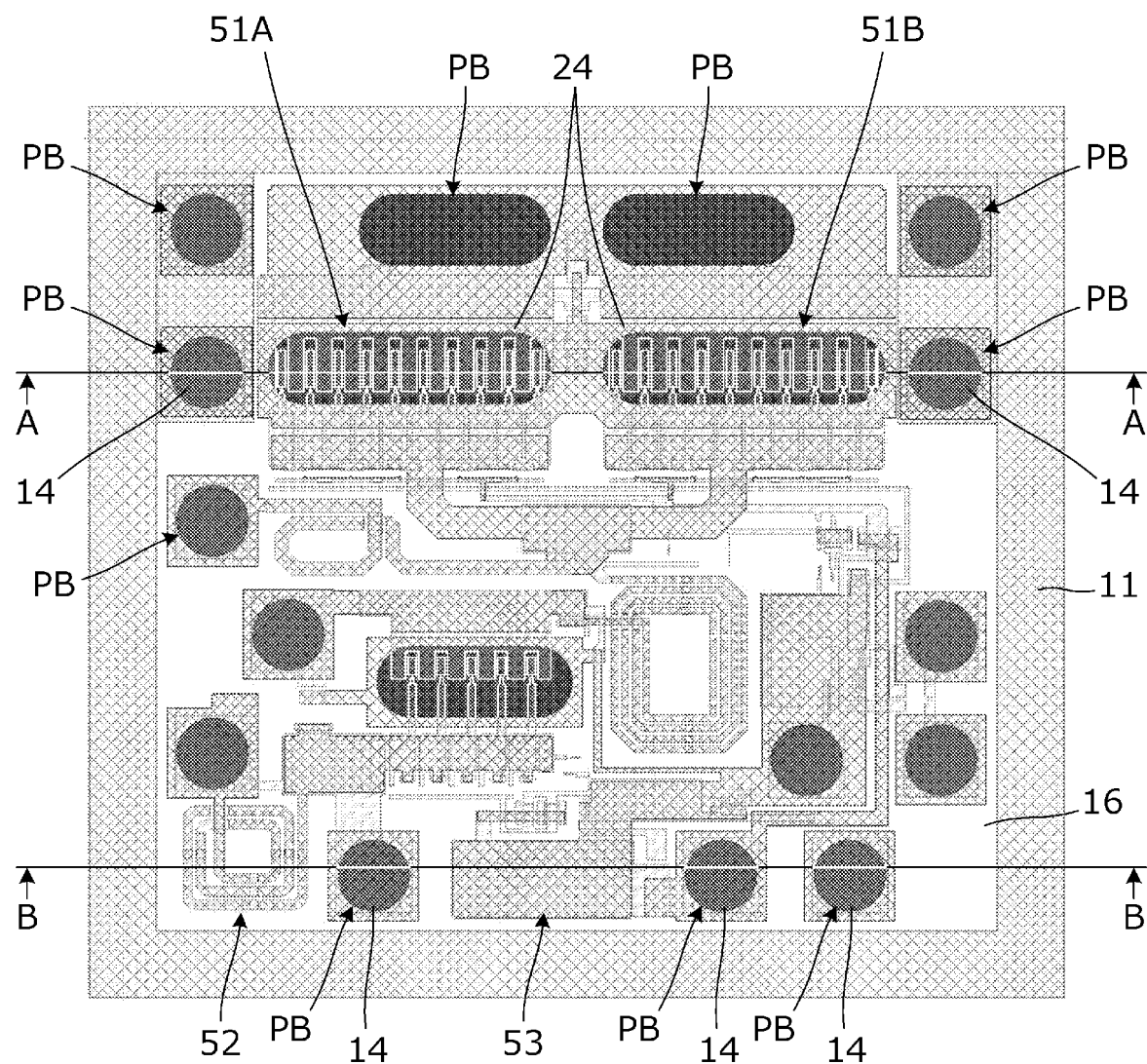
FIG. 10 is a plan view of a semiconductor device 140 according to a fourth embodiment.
Figure 11A:
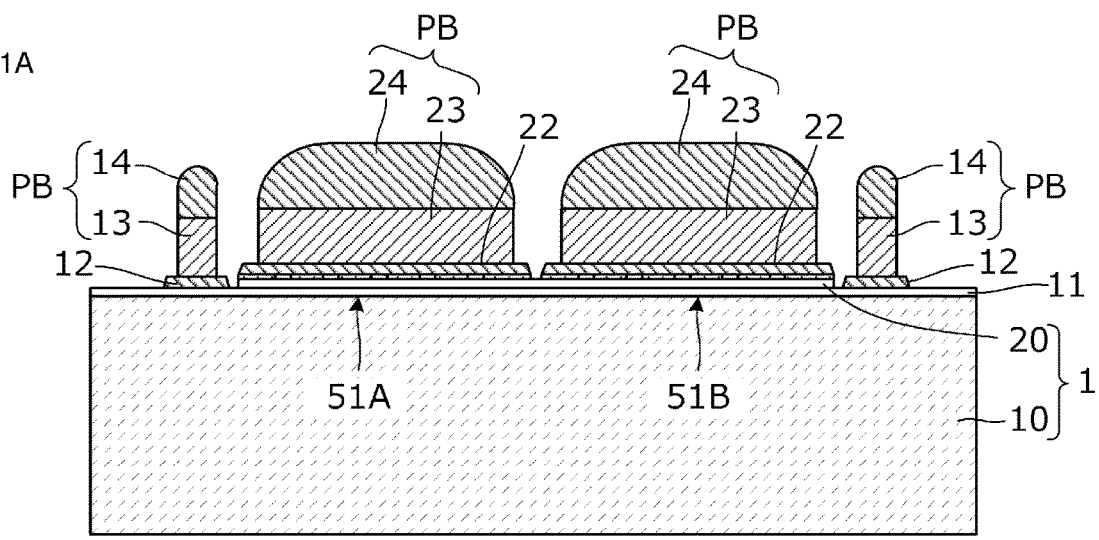
FIG. 11A is a cross-sectional view of the semiconductor device illustrated in FIG. 10 taken along the line A-A.
Figure 11B:
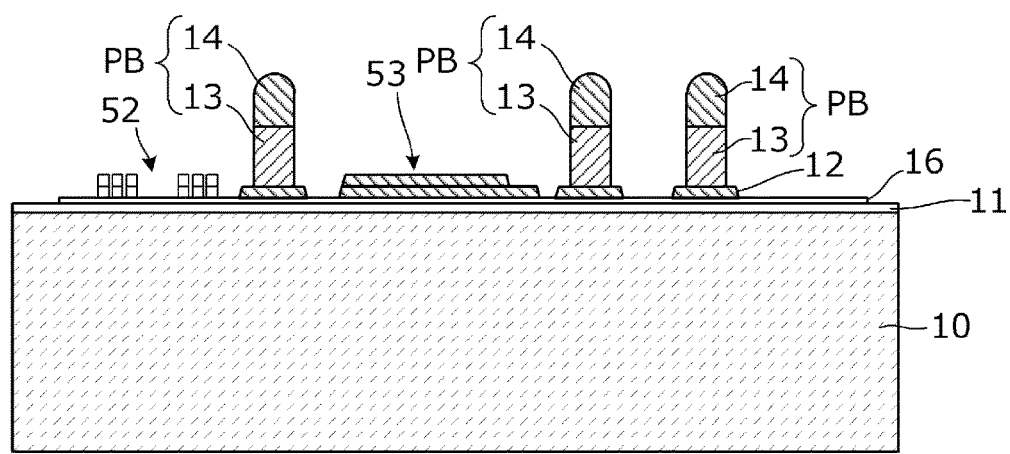
FIG. 11B is a cross-sectional view of the semiconductor device illustrated in FIG. 10 taken along the line B-B.

FIG. 10 is a plan view of a semiconductor device 140 according to the fourth embodiment. FIGS. 11A and 11B are cross-sectional views of the semiconductor device 140 illustrated in FIG. 10 which are taken in the lines A-A and B-B, respectively.

The semiconductor device 140 according to the fourth embodiment includes a plurality of conductor pillars and solder layers 14 and 24 disposed on the conductor pillars. As illustrated in FIGS. 10 and 11A, a plurality of unit transistors are disposed at predetermined positions in the semiconductor device 140 in the horizontal direction in FIG. 10 to form heterojunction bipolar transistors (HBTs) 51A and 51B connected in parallel. A conductor pillar bump PB consisting of a conductor pillar 23 and a solder layer 24 is disposed on the upper portion of each of the HBTs 51A and 51B. The structures of the HBTs 51A and 51B, the conductor pillars 23, and the solder layers 24 are the same as those described in the first embodiment.

A conductor pillar bump PB consisting of a conductor pillar 13 and a solder layer 14 is arranged adjacent to each of the HBTs 51A and 51B.

The conductor pillar bump PB is also disposed at positions other than the cross section A-A as illustrated in FIG. 10. Those conductor pillar bumps PBs are disposed in the vicinity of the HBTs 51A and 51B. The above-described structure enables the heat produced by the HBTs 51A and 51B to be dissipated with a high degree of efficiency.

The semiconductor device 140 includes, in addition to the HBTs 51A and 51B, an LCR circuit constituted by, for example, an inductor formed by a spiral conductor pattern, a capacitor formed by electrodes facing each other with a dielectric layer interposed therebetween, and a resistance element formed by a resistor film pattern.

As illustrated in FIGS. 10 and 11B, a joint layer 11 is disposed on the surface of the first base 10. An insulator layer 16 is disposed on predetermined portions of the surface of the joint layer 11. A spiral inductor 52 is disposed on the surface of the insulator layer 16. A conductor pillar bump PB consisting of a conductor pillar 13 and a solder layer 14 is disposed at a position adjacent to the spiral inductor 52. A metal-insulator-metal-capacitor (MIMC) 53 is disposed on the predetermined portion of the semiconductor device 140 as illustrated in FIGS. 10 and 11B. A conductor pillar bump PB consisting of a conductor pillar 13 and a solder layer 14 is disposed at a position adjacent to the MIMC 53.

Fifth Embodiment

In a fifth embodiment, a method for producing the second base and a method for joining the second base to the first base are described.

FIGS. 12A to 12D are perspective views illustrating the steps according to the fifth embodiment. Although the semiconductor devices are produced on a wafer-to-wafer basis in reality, FIGS. 12A to 12D illustrate only one semiconductor device.

Figure 12A:
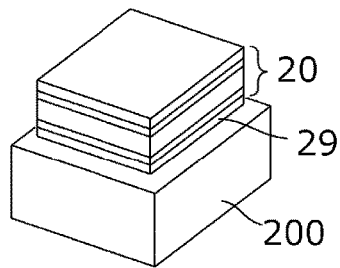
FIGS. 12A to 12D are perspective diagrams illustrating the steps of a method for producing a semiconductor device according to a fifth embodiment.

First, as illustrated in FIG. 12A, a release layer 29 is formed on a base substrate 200 that is a compound semiconductor base, a semiconductor thin film is formed on the upper portion of the release layer 29 by epitaxial growth, and a plurality of circuit elements and an electrode connected to the circuit elements are formed in the semiconductor thin film. This portion serves as a second base 20 in the subsequent step.

Figure 12B:
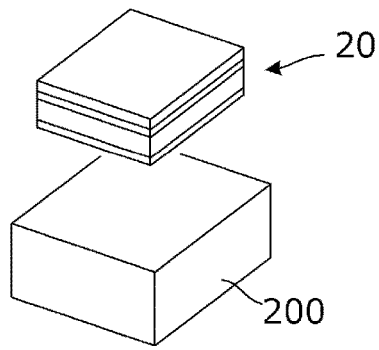

As illustrated in FIG. 12B, only the release layer 29 is selectively etched to separate the second base 20 (i.e., semiconductor thin film chip) from the base substrate 200.

Figure 12C:
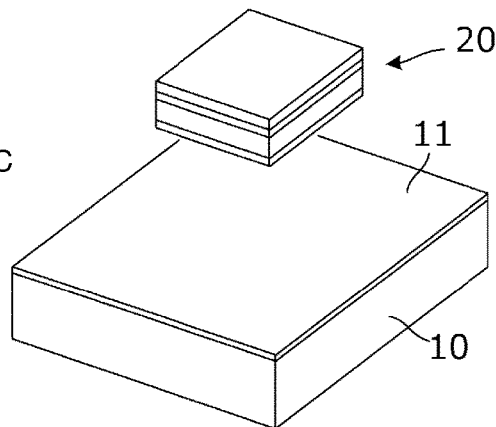
Figure 12D:
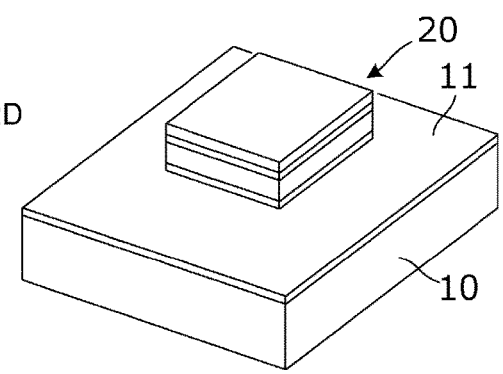

As illustrated in FIG. 12C, a joint layer 11 is formed on a first base 10 in another step. Then, as illustrated in FIG. 12D, the second base 20 is pressed against and brought into close contact with the surface of the joint layer 11 in order to join (i.e., bond) the second base 20 to the first base 10. That is, the semiconductor thin film chip is transferred from the base substrate 200 to the first base 10. The second base 20 is joined to the first base 10 as a result of, for example, Au included in the joint layer 11 diffusing into GaAs included in the second base to form a eutectic alloy.

The formation of the circuit elements and the electrode in the second base 20 is not necessarily done in the step illustrated in FIG. 12A and may also be done by subjecting the second base 20 to a processing, such as photolithography or etching, after the second base 20 has been joined to the first base 10 as illustrated in FIG. 12D.

For separating and transferring the semiconductor thin film chip, the method disclosed in Japanese Patent No. 5132725 may be used. Specifically, when the second base 20 (i.e., the semiconductor thin film chip) is separated from the base substrate 200 as illustrated in FIG. 12B, the second base 20 is separated from the base substrate 200 while being supported by a support body. When the second base 20 is joined to the first base 10 as illustrated in FIG. 12C, the second base 20 is joined to the first base 10 while being supported by the support body. Note that the illustration of the support body is omitted in FIGS. 12B and 12C in order to clearly illustrate the second base 20.

Figure 13:
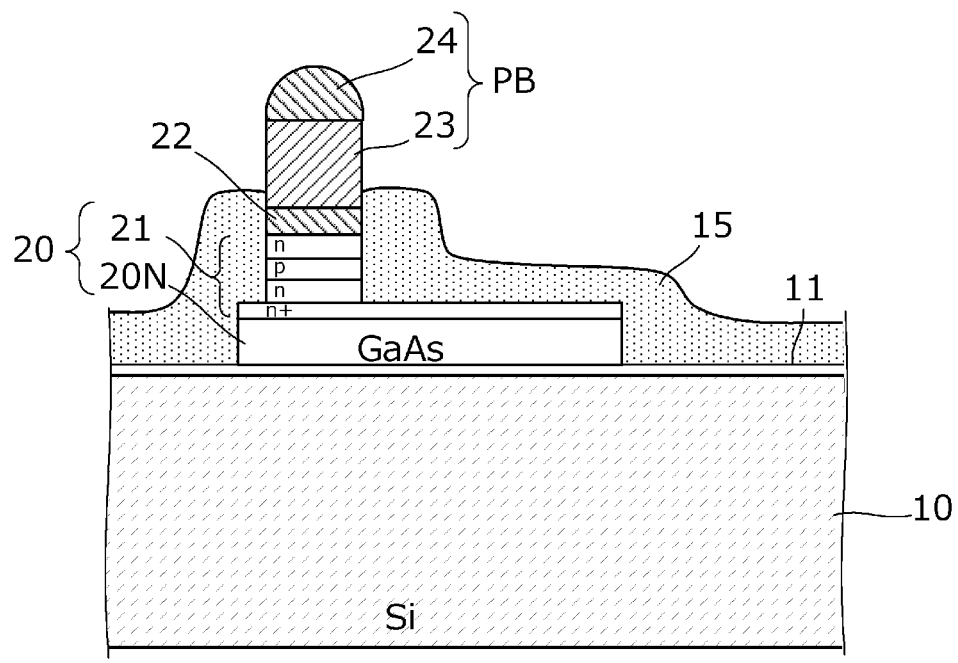
FIG. 13 is a partial cross-sectional view of a semiconductor device formed by treating a first base 10 after the transfer of a semiconductor thin film chip.

FIG. 13 is a partial cross-sectional view of a semiconductor device produced by transferring the semiconductor thin film chip to the first base 10 and subjecting the first base 10 to a processing. The second base 20 includes a semiconductor base 20N and a circuit element 21 that is a bipolar transistor disposed on the surface of the semiconductor base 20N. A second base-side electrode 22 is disposed on the upper portion of the second base 20. In this example, the second base-side electrode 22 is an emitter wire. A flattening resin layer 15 is disposed on the surfaces of the joint layer 11 disposed on the first base and the second base 20.

A conductor pillar bump PB consisting of a conductor pillar 23 and a solder layer 24 is disposed on the second base-side electrode 22 that is an emitter wire.

The thicknesses of the semiconductor base 20N and the epitaxial layer 20D are a few micrometers. For example, the semiconductor base 20N has a thickness of 1 μm, and the epitaxial layer 20D has a thickness of 3 μm. Although wire bonding of a compound semiconductor device commonly requires that the total thickness of the semiconductor base 20N and the epitaxial layer 20D be 75 μm or more, a semiconductor device that is extremely thin (i.e., low in profile) as a whole may be produced in this embodiment since the thickness of the second base 20 attached to the upper portion of the first base 10 is only a few micrometers.

Sixth Embodiment

In a sixth embodiment, a semiconductor device that includes a joint layer having a characteristic structure, with which the first base 10 and the second base 20 are joined to each other, is described.

Figure 14:
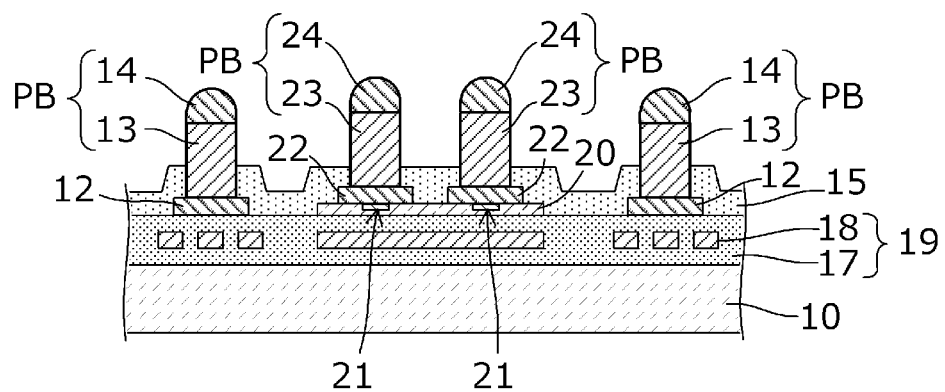
FIG. 14 is a cross-sectional view of a semiconductor device 160 according to a sixth embodiment.

FIG. 14 is a cross-sectional view of a semiconductor device 160 according to the sixth embodiment. The semiconductor device 160 includes a first base 10 and a second base 20 disposed on the first base 10. The second base 20 includes a semiconductor base composed of a compound semiconductor and an epitaxial layer disposed on the semiconductor base. A plurality of circuit elements 21 are formed in the epitaxial layer. In this example, the first base 10 is a Si base, and the second base 20 is a GaAs base.

A joint layer 19 is interposed between the first base 10 and the second base 20. That is, the first base 10 and the second base 20 are joined to each other with the joint layer 19 interposed therebetween. First base-side electrodes 12 are disposed on the surface of the joint layer 19. Second base-side electrodes 22 are disposed on the surface of the second base 20. A flattening resin layer 15 is disposed on the surfaces of the first base 10 and the second base 20. A conductor pillar bump PB consisting of a conductor pillar 13 and a solder layer 14 is disposed on the upper portion of each of the first base-side electrodes 12. A conductor pillar bump PB consisting of a conductor pillar 23 and a solder layer 24 is disposed on the upper portion of each of the second base-side electrodes 22.

The joint layer 19 is a composite material layer including an insulator layer 17 and a metal layer 18. Examples of the insulator layer 17 include a layer composed of a Si compound, such as a $SiO_2$ film or a SiN film; and a resin layer, such as a polyimide (PI) film. Examples of the metal layer 18 include a Cu film and an Al film. The joint layer 19 has a three-layer structure. The joint layer 19 includes an insulator layer 17 disposed on the surface of the first base 10 as a first layer, a metal layer 18 disposed on the surface of the insulator layer 17 as a second layer, and an insulator layer 17 disposed on the surface of the metal layer 18 as a third layer. The metal layer 18 is formed in a specific pattern; a portion of the metal layer 18 is formed in a specific pattern in the vicinity of the second base 20 and in the vicinities of the first base-side electrodes 12.

When the joint layer 19 is a composite material layer including an insulator layer 17 and a metal layer 18, the stress generated in the joint layer 19 due to the difference in coefficient of linear expansion between the first base 10 and the second base 20 may be reduced. The coefficients of linear expansion of the first base 10, the second base 20, and the joint layer 19 are as follows. For example, while the coefficient of linear expansion of a Si base, which is used as a first base 10, is 2.60 ppm/° C. and the coefficient of linear expansion of a GaAs base, which is used as a second base 20, is 5.73 ppm/° C., the coefficient of linear expansion of a $SiO_2$ film composed of tetraethoxysilane (TEOS) is 0.57 ppm/° C. and the coefficient of linear expansion of a SiN film is 2.30 ppm/° C. That is, a $SiO_2$ film and a SiN film have a lower coefficient of linear expansion than the first base 10 or the second base 20. The coefficient of linear expansion of a Cu film, which is used as a metal layer 18, is 17.0 ppm/° C. That is, a Cu film has a higher coefficient of linear expansion than the first base 10 or the second base 20. Therefore, the coefficient of linear expansion of the joint layer 19 is intermediate between the coefficients of linear expansion of the first base 10 and the second base 20. This may reduce the stress that occurs at the interface between the second base 20 and the first base 10.

When the insulator layer 17 is a layer composed of a Si compound, such as a $SiO_2$ film or a SiN film, it becomes easy to form the insulator layer 17 on the first base 10. Furthermore, the strength at which the first base 10 and the insulator layer 17 are joined to each other may be increased.

Only the uppermost part of the insulator layer 17 may be a resin layer. In the case where at least a part of the insulator layer 17 is a resin film, the stress may be absorbed due to the flexibility of the insulator layer 17 regardless of the magnitude relation of the coefficient of linear expansion. The insulator layer 17 may also reduce the stress that occurs between the metal layer 18 and the insulator layer 17 inside the joint layer 19.

The second base 20 may expand and contract upon the circuit elements 21 disposed in the second base 20 producing heat and being paused. The degree of expansion and contraction of the second base 20 is larger than the degree of expansion and contraction of the first base 10, which is disposed away from the circuit elements 21. This applies even when the coefficients of linear expansion of the first base 10, the second base 20, and the joint layer 19 do not meet the above relationship. According to this embodiment, the presence of the joint layer 19 may reduce the stress that occurs at the interface between the second base 20 and the first base 10.

Figure 15A:
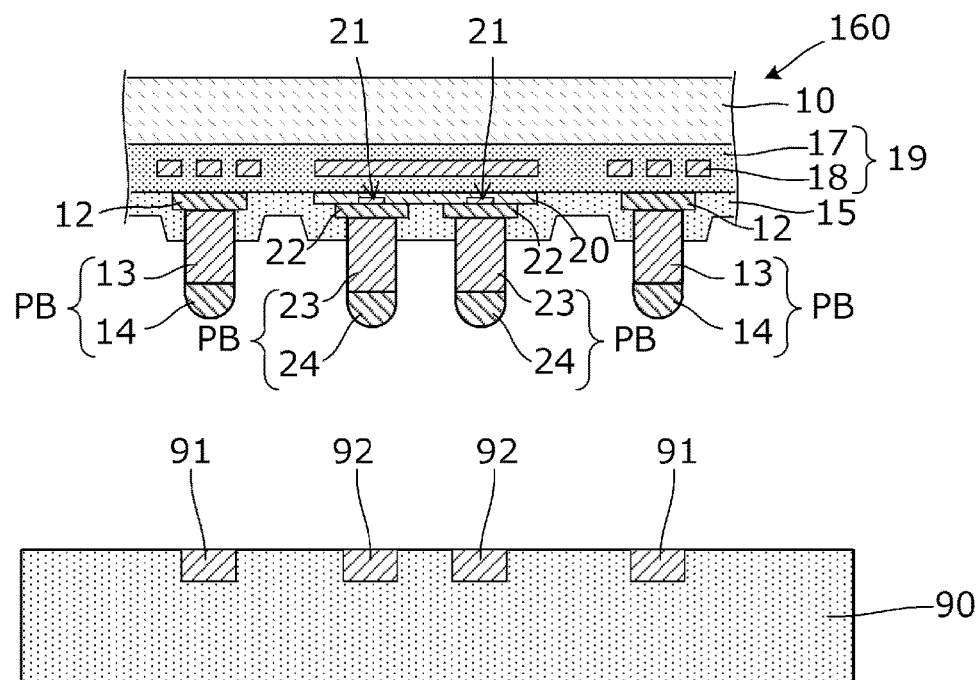
FIGS. 15A and 15B are cross-sectional views of the semiconductor device 160 attached to a mounting substrate.
Figure 15B:
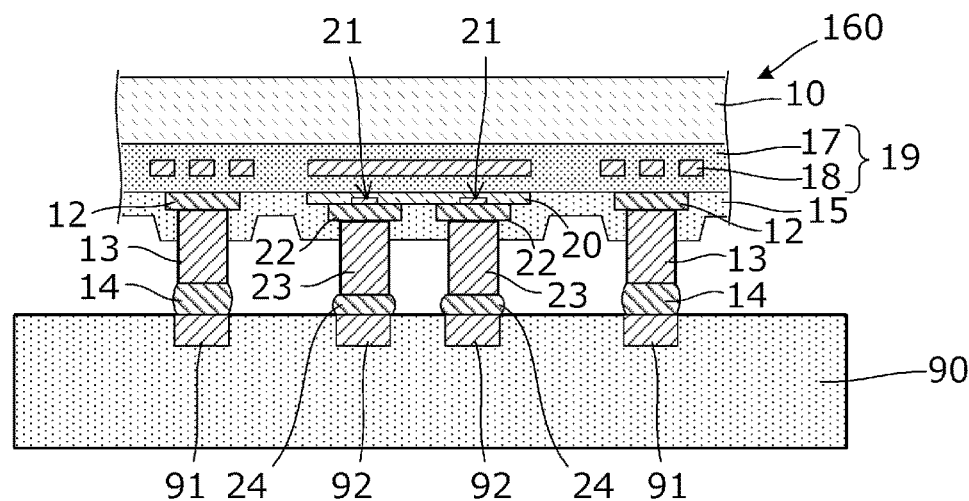

FIGS. 15A and 15B are cross-sectional views of the semiconductor device 160 attached to a mounting substrate. FIG. 15A is a cross-sectional view of the semiconductor device 160 that is to be attached to a mounting substrate 90. FIG. 15B is a cross-sectional view of the semiconductor device 160 that has been attached to a mounting substrate 90.

Mounting substrate-side electrodes 91 and 92 are disposed in the mounting substrate 90. By aligning the solder layers 14 and 24 of the semiconductor device 160 with the mounting substrate-side electrodes 91 and 92 and subsequently performing heating and pressurizing, the solder layers 14 and 24 are connected to the mounting substrate-side electrodes 91 and 92 as illustrated in FIG. 15B.

As described above, the conductor pillar bumps PB disposed on the second base-side electrodes 22 serve as terminals with which the circuit elements 21 disposed in the second base 20 are connected to a circuit included in the mounting substrate. The conductor pillar bumps PB disposed on the second base-side electrodes 22 serve also as heat-dissipating bumps through which the heat produced by the circuit elements 21 disposed in the second base 20 is dissipated into the mounting substrate.

The metal layer 18 included in the joint layer 19 increases the thermal conductivity of the joint layer 19. Consequently, the heat produced by the circuit elements 21 disposed in the second base 20 is dissipated also into the first base 10 through the joint layer 19. The metal layer 18 included in the joint layer 19 also increases the thermal conductivity of the joint layer 19 in the planar direction (i.e., the horizontal direction). Thus, the heat produced by the circuit elements 21 is dissipated also into the mounting substrate 90 through parts of the metal layer 18 which are disposed in the vicinity of the first base-side electrodes 12 and the conductor pillar bumps PB disposed on the first base-side electrodes 12. The heat produced by the circuit elements 21 is dissipated also into the first base 10 through the parts of the metal layer 18 which are disposed in the vicinity of the first base-side electrodes 12.

Although the metal layer 18 is illustrated as an independent component in the cross sectional diagram of FIG. 14, the metal layer 18 may be connected to the first base-side electrodes 12. Alternatively, the metal layer 18 may be connected to a circuit disposed in the first base 10.

Seventh Embodiment

In a seventh embodiment, a semiconductor device that includes a joint layer having a characteristic structure, with which the first base 10 and the second base 20 are joined to each other, is described.

Figure 16:
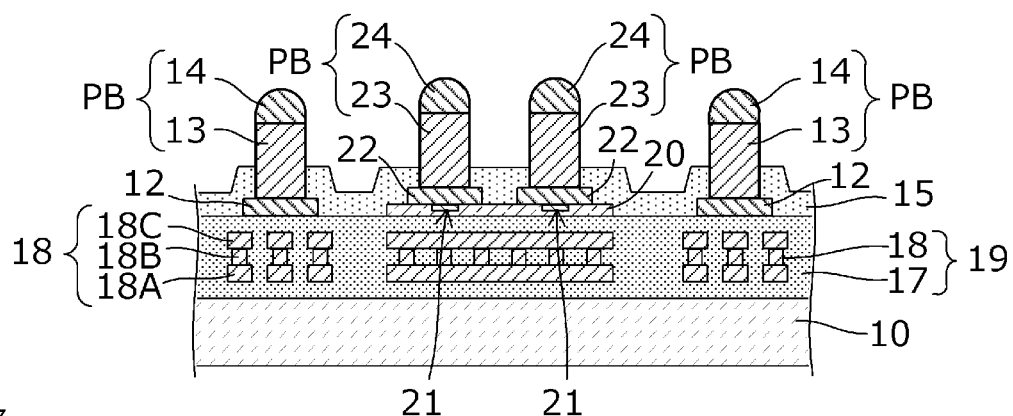
FIG. 16 is a cross-sectional view of a semiconductor device 170 according to a seventh embodiment.

FIG. 16 is a cross-sectional view of a semiconductor device 170 according to the seventh embodiment. The semiconductor device 170 includes a first base 10 and a second base 20 disposed on the first base 10. The structure of the semiconductor device 170 is the same as that of the semiconductor device according to the sixth embodiment, except that the structure of the joint layer 19 is different from that of the joint layer 19 according to the sixth embodiment which is illustrated in FIG. 14 as an example.

The joint layer 19 is a composite material layer including an insulator layer 17 and a metal layer 18. Examples of the insulator layer 17 include a layer composed of a Si compound, such as a $SiO_2$ film or a SiN film; and a resin layer, such as a polyimide (PI) film. Examples of the metal layer 18 include a Cu film and an Al film. The joint layer 19 has a five-layer structure. As in the example illustrated in FIG. 14, a portion of the metal layer 18 is formed in a specific pattern in the vicinity of the second base 20 and in the vicinities of the first base-side electrodes 12.

The joint layer 19 is formed by the following steps.
(1) A part of an insulator layer 17 is formed on the surface of the first base 10 as a first layer.
(2) A metal layer 18A is formed on the surface of the part of the insulator layer 17 as a second layer.
(3) Another part of the insulator layer 17 is formed on the surface of the metal layer 18 as a third layer.
(4) Cavities are formed in predetermined portions of the part of the insulator layer 17 (i.e., the portions below which the metal layer 18A is formed).
(5) A metal layer 18C is formed on the part of the insulator layer 17, while a metal layer 18B is formed in the cavities.
(6) The other part of the insulator layer 17 is formed as an uppermost layer.

According to the embodiment, since the metal layer 18 has a multilayer structure, the thermal resistance of the joint layer 19 may be maintained to be low even when the thickness of the joint layer 19 is increased. Accordingly, the heat generated by the circuit elements 21 may be dissipated readily. Furthermore, since the joint layer 19 has a large heat capacity, it is possible to effectively limit temperature rise even when the circuit elements 21 quickly produce heat.

As described in the sixth embodiment, the metal layer 18 may be connected to the first base-side electrodes 12, and the metal layer 18 may be connected to a circuit disposed in the first base 10.

The structure, action, and advantageous effects of each of the embodiments are described above. The aspects disclosed in the foregoing embodiments are as follows.

A semiconductor device according to an aspect of the present disclosure includes a substrate 1 provided with a circuit element 21 and an electrode connected to the circuit element, the circuit element 21 and the electrode being disposed on the surface of the substrate 1; and a conductor pillar bump PB for external connection which is disposed on the substrate 1 and connected to the electrode or the circuit element 21. The substrate 1 includes a first base 10 and a second base 20 disposed on the first base 10, the second base 20 being composed of a material different from the material constituting the first base 10. The circuit element 21 and the electrode are disposed on the second base 20. The first base 10 has a higher thermal conductivity than the second base 20.

The above structure enables the heat to be dissipated through the conductor pillar bump PB and the first base 10. That is, the paths along which the heat is dissipated from both surfaces of the semiconductor device may be formed. This enables a high heat-dissipation capacity. Furthermore, since the circuit element is disposed in a semiconductor region formed in the second base 20, on which no limitation is placed in terms of thermal conductivity, a circuit that effectively utilizes the physical properties of the second base 20 may be formed and the heat-dissipation capacity produced by the first base 10 may be maintained to be high.

In a semiconductor device according to another aspect of the present disclosure, the first base 10 is a base composed of an elemental semiconductor, and the second base 20 is a base composed of a compound semiconductor. When the first base 10 is a base composed of an elemental semiconductor, a high heat-dissipation capacity may be achieved as a whole, due to the dissipation of the heat through the first base 10. When the second base 20 is a base composed of a compound semiconductor, the electrical insulating property of the second base 20 may be enhanced. This enables the formation of a circuit having excellent high-frequency characteristics.

In a semiconductor device according to still another aspect of the present disclosure, the second base 20 has a smaller thickness than the first base 10. This enables a large heat-dissipation effect to be achieved by the first base 10.

In a semiconductor device according to yet another aspect of the present disclosure, the circuit element 21 is a heating element that generates heat while being operated, and the conductor pillar bump PB is disposed in the immediate vicinity of the circuit element 21 that is the heating element. In such a case, the conductor pillar bump PB forms a short heat-conduction path and the heat generated by the circuit element 21 may be effectively dissipated through the conductor pillar bump PB.

In a semiconductor device according to still another aspect of the present disclosure, the second base 20 is arranged not to protrude from the edge of the first base 10. In such a case, the thermal resistance of the substrate that includes the first base 10 and the second base 20 may be further reduced and, consequently, a large heat-dissipation effect may be achieved by the first base 10.

A semiconductor device according to yet another aspect of the present disclosure further includes a joint layer 11 that is interposed between the first base 10 and the second base 20 and joins the first base 10 and the second base 20 to each other. The joint layer 11 is composed of a metal having a higher thermal conductivity than the second base 20. In such a case, heat conduction from the second base 20 to the first base 10 is maintained and, consequently, the capability of the first base 10 to dissipate (i.e., exhaust) heat is maintained. Furthermore, a capability to dissipate heat from the first base 10 through the joint layer 11 may be maintained. That is, the joint layer 11 does not reduce a capability to dissipate heat from the first base 10.

In a semiconductor device according to still another aspect of the present disclosure, the joint layer 11 is composed of a metal having a lower modulus of elasticity than the second base 20. The above structure may reduce the thermal stress caused due to the difference in coefficient of linear expansion between the first base 10 and the second base 20.

In a semiconductor device according to yet another aspect of the present disclosure, the joint layer 11 is composed of a metal and the semiconductor device further includes an alloy layer interposed between the joint layer 11 and the first base 10, the alloy layer being formed by alloying the joint layer 11 with the first base 10. The above structure may increase the adhesion and thermal conductivity between the first base 10 and the second base 20.

A semiconductor device according to still another aspect of the present disclosure further includes a joint layer 11 interposed between the first base 10 and the second base 20. The joint layer 11 is composed of a dielectric having a lower dielectric constant than the second base 20. The above structure may limit the high-frequency loss caused by the first base 10 and enable the formation of a circuit having excellent high-frequency characteristics.

In a semiconductor device according to yet another aspect of the present disclosure, the joint layer 11 is a dielectric and has a lower modulus of elasticity than the second base 20. The above structure may reduce the thermal stress caused due to the difference in coefficient of linear expansion between the first base 10 and the second base 20.

A semiconductor device according to still another aspect of the present disclosure further includes a joint layer 11 interposed between the first base 10 and the second base 20 and the joint layer 11 is an insulator having a higher electric resistivity than the first base 10. The above structure may enhance the electrical insulating property between the first base 10 and the second base 20, limit the high-frequency loss caused by the first base 10, and enable the formation of a circuit having excellent high-frequency characteristics.

In a semiconductor device according to yet another aspect of the present disclosure, the joint layer 11 has a higher thermal conductivity than the first base 10. The above structure may reduce the virtual thermal resistance of a portion constituted by the joint layer 11 and the first base 10 and enable a high heat-dissipation capacity to be achieved.

A semiconductor device according to still another aspect of the present disclosure further includes a joint layer 19 interposed between the first base 10 and the second base 20. The joint layer 19 is a composite material layer including an insulator layer 17 and a metal layer 18. The above structure may reduce the stress caused between the first base 10 and the second base 20 due to the difference in coefficient of linear expansion between the first base 10 and the second base 20. Furthermore, the stress caused at the interface between the second base 20 and the first base 10 due to the expansion and contraction of the second base 20 which occurs when the circuit element 21 disposed on the second base 20 generates heat or is paused, which is more severe than the expansion and contraction of the first base 10, may be limited.

In a semiconductor device according to yet another aspect of the present disclosure, the first base 10 is a Si base and the insulator layer 17 included in the joint layer 19 is a layer composed of a Si compound. This makes it easy to form the insulator layer 17 on the first base 10 and may increase the bonding strength between the first base 10 and the insulator layer 17.

In a semiconductor device according to still another aspect of the present disclosure, at least a part of the insulator layer 17 is composed of a resin. This enables the stress that occurs between the metal layer 18 and the insulator layer 17 in the joint layer 19 to be reduced with the insulator layer 17.

A semiconductor device according to yet another aspect of the present disclosure further includes a first base-side electrode 12 disposed on the surface of a portion of the first base 10 which does not overlap the second base 20 and a conductor pillar bump PB is connected to the first base-side electrode 12. The above structure enables heat to be dissipated from the conductor pillar bump PB connected to the first base-side electrode 12. The above structure may also increase the efficiency with which heat is conducted to the circuit board, to which the semiconductor device is attached, through the conductor pillar bump PB. Consequently, the heat-dissipation capacity of the circuit board may also be enhanced.

A method for producing a semiconductor device according to an aspect of the present disclosure is a method for producing a semiconductor device including a substrate 1, a circuit element 21 disposed on the surface of the substrate 1, an electrode disposed on the surface of the substrate 1, the electrode being connected to the circuit element 21, and a conductor pillar bump PB for external connection which is disposed on the substrate 1 and electrically connected to the electrode or the circuit element 21, the substrate 1 including a first base 10 and a second base 20 disposed on the first base 10, the circuit element 21 and the electrode being disposed on the second base 20. The method includes a step of forming a semiconductor thin film including the circuit element 21 and the electrode disposed on the surface of the semiconductor thin film on a compound semiconductor base substrate 200 with a release layer 29 interposed between the semiconductor thin film and the compound semiconductor base substrate 200; a step of removing the release layer 29 by etching to separate the semiconductor thin film from the base substrate 200 that is a compound semiconductor base; a step of joining the semiconductor thin film constituting the second base 20 to a predetermined part of the first base 10 that is an elemental semiconductor base; and a step of forming a conductor pillar bump PB for external connection on the second base 20, the conductor pillar bump being connected to the electrode or the circuit element 21.

The above production method enables the production of a semiconductor device having a high power although being compact or a semiconductor device that is compact although having a high power.

The description of the foregoing embodiments is to be considered in all aspects as illustrative and not restrictive. Various modifications and changes may be made by those skilled in the art. The scope of the present disclosure should be determined not by the foregoing embodiments but by the appended claims. The scope of the present disclosure includes any modifications to the embodiments within a scope equivalent to the claims.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a substrate, the substrate including a first base and a second base disposed on or above the first base, the second base being composed of a material different from a material constituting the first base, and the first base having a higher thermal conductivity than the second base;
    a circuit element disposed on or above a surface of the substrate;
    an electrode disposed on or above the surface of the substrate, the electrode being connected to the circuit element;
    a conductor protrusion for external connection, the conductor protrusion being disposed on or above the substrate and connected to the circuit element or the electrode; and
    a joint layer interposed between the first base and the second base, the joint layer joining the first base and the second base to each other,
    wherein the joint layer is composed of a metal having a higher thermal conductivity than the second base,
    the circuit element and the electrode are disposed on or above the second base,
    the circuit element, the electrode, and the conductor protrusion are stacked in this order from the surface of the substrate,
    the first base is a base composed of an elemental semiconductor, and
    the second base is a base composed of a compound semiconductor.

2. The semiconductor device according to claim 1, wherein
    the second base has a smaller thickness than the first base.

3. The semiconductor device according to claim 2, wherein
    the circuit element is a heating element that generates heat while being operated, and
    the conductor protrusion is disposed in the immediate vicinity of the circuit element that is the heating element.

4. The semiconductor device according to claim 2, wherein
    the second base is arranged not to protrude from an edge of the first base.

5. The semiconductor device according to claim 1, wherein
    the circuit element is a heating element that generates heat while being operated, and
    the conductor protrusion is disposed in the immediate vicinity of the circuit element that is the heating element.

6. The semiconductor device according to claim 1, wherein
    the second base is arranged not to protrude from an edge of the first base.

7. The semiconductor device according to claim 1, wherein
    the joint layer has a lower modulus of elasticity than the second base.

8. The semiconductor device according to claim 1, further comprising:
    an alloy layer interposed between the joint layer and the second base, the alloy layer being formed by alloying the joint layer with the second base.

9. The semiconductor device according to claim 1, further comprising:
    a first base-side electrode disposed on or above a surface of a portion of the first base, the portion not overlapping the second base, and an other conductor protrusion for external connection, the other conductor protrusion being connected to the first base-side electrode.

* * * * *